(12) United States Patent
Huynh

(10) Patent No.: US 8,660,170 B1
(45) Date of Patent: Feb. 25, 2014

(54) APPARATUS AND METHOD FOR CALIBRATING THE I/Q MISMATCH IN A QUADRATURE BANDPASS SAMPLING RECEIVER

(71) Applicant: Phuong Thu-Minh Huynh, Fairfax, VA (US)

(72) Inventor: Phuong Thu-Minh Huynh, Fairfax, VA (US)

( * ) Notice: Subject to any disclaimer, the term of this patent is extended or adjusted under 35 U.S.C. 154(b) by 0 days.

(21) Appl. No.: 13/709,036

(22) Filed: Dec. 9, 2012

(51) Int. Cl.
H04B 3/46 (2006.01)

(52) U.S. Cl.
USPC .......................................... 375/224; 375/324

(58) Field of Classification Search
CPC .................................... H04L 27/3863
USPC .................................... 375/224, 324
See application file for complete search history.

(56) References Cited

U.S. PATENT DOCUMENTS

| | | | | |
|---|---|---|---|---|
| 4,003,054 A * | 1/1977 | Goldstone | | 342/174 |
| 5,705,949 A * | 1/1998 | Alelyunas et al. | | 329/304 |
| 6,330,290 B1 * | 12/2001 | Glas | | 375/324 |
| 7,020,226 B1 * | 3/2006 | Kirkland | | 375/355 |
| 2002/0097812 A1 * | 7/2002 | Wiss | | 375/316 |
| 2003/0007574 A1 * | 1/2003 | Li et al. | | 375/316 |
| 2003/0031273 A1 * | 2/2003 | Mohindra | | 375/324 |
| 2003/0206603 A1 * | 11/2003 | Husted | | 375/324 |
| 2003/0231726 A1 * | 12/2003 | Schuchert et al. | | 375/350 |
| 2004/0013204 A1 * | 1/2004 | Dinur | | 375/261 |
| 2004/0203472 A1 * | 10/2004 | Chien | | 455/68 |
| 2005/0047536 A1 * | 3/2005 | Wu et al. | | 375/346 |
| 2005/0118963 A1 * | 6/2005 | Chiu | | 455/115.1 |
| 2007/0291883 A1 * | 12/2007 | Welz et al. | | 375/350 |
| 2008/0025437 A1 * | 1/2008 | Huynh | | 375/324 |
| 2011/0182335 A1 * | 7/2011 | Pratt et al. | | 375/224 |
| 2013/0223492 A1 * | 8/2013 | Dark et al. | | 375/224 |

* cited by examiner

Primary Examiner — Juan A Torres
(74) Attorney, Agent, or Firm — Phuong Huynh

(57) ABSTRACT

A calibration technique to compensate for the quadrature phase error between the in-phase and quadrature sampling clocks controlling the quadrature bandpass sampling delta-sigma analog-to-digital demodulator (QBS-ADD) is provided. A low-frequency test tone is injected in the feedback path, up-converted to the radio frequency (RF) frequency, and added to the input of the QBS-ADD. The test tone is demodulated by the QBS-ADD into an in-phase signal and a quadrature signal. The in-phase and quadrature signals are converted into the frequency domain by the discrete Fourier transform. The quadrature phase error is quantified based on the complex Fourier complex coefficients; and the phase difference between the in-phase and quadrature sampling clocks is corrected.

18 Claims, 10 Drawing Sheets

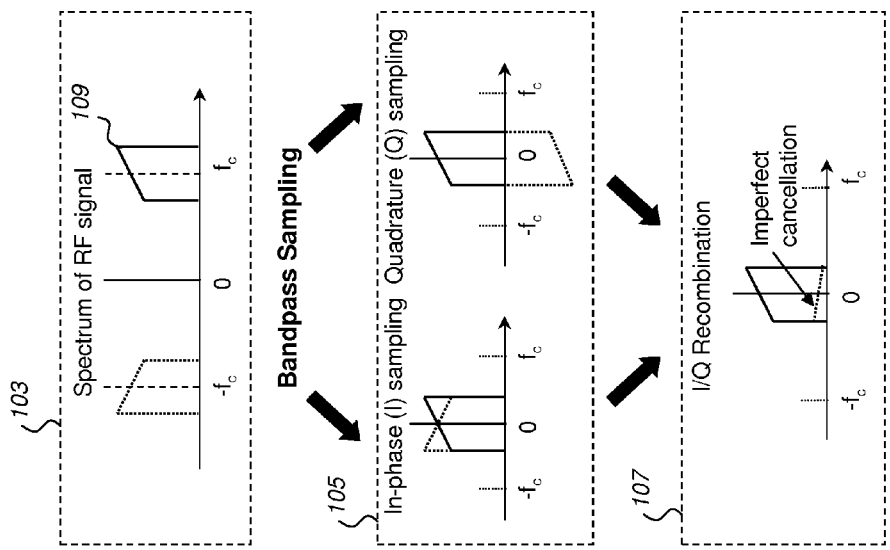

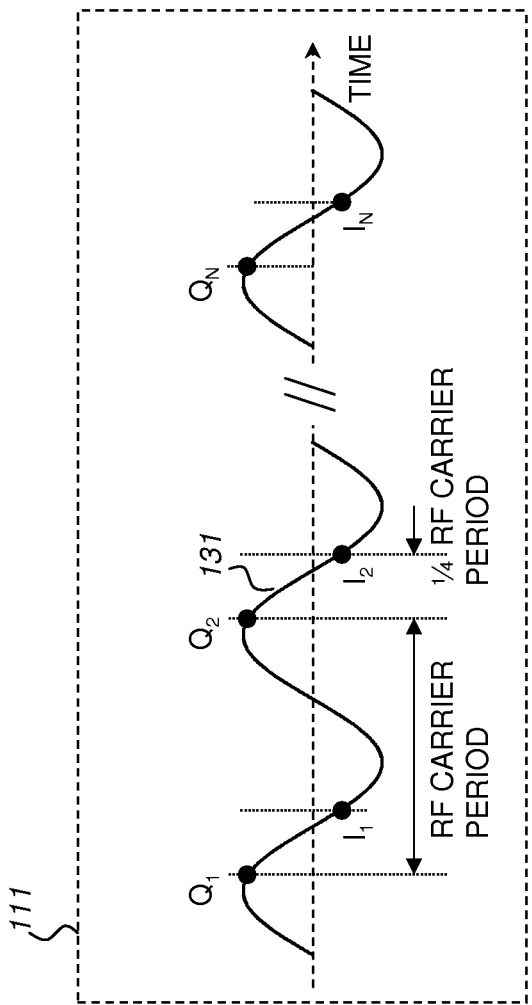

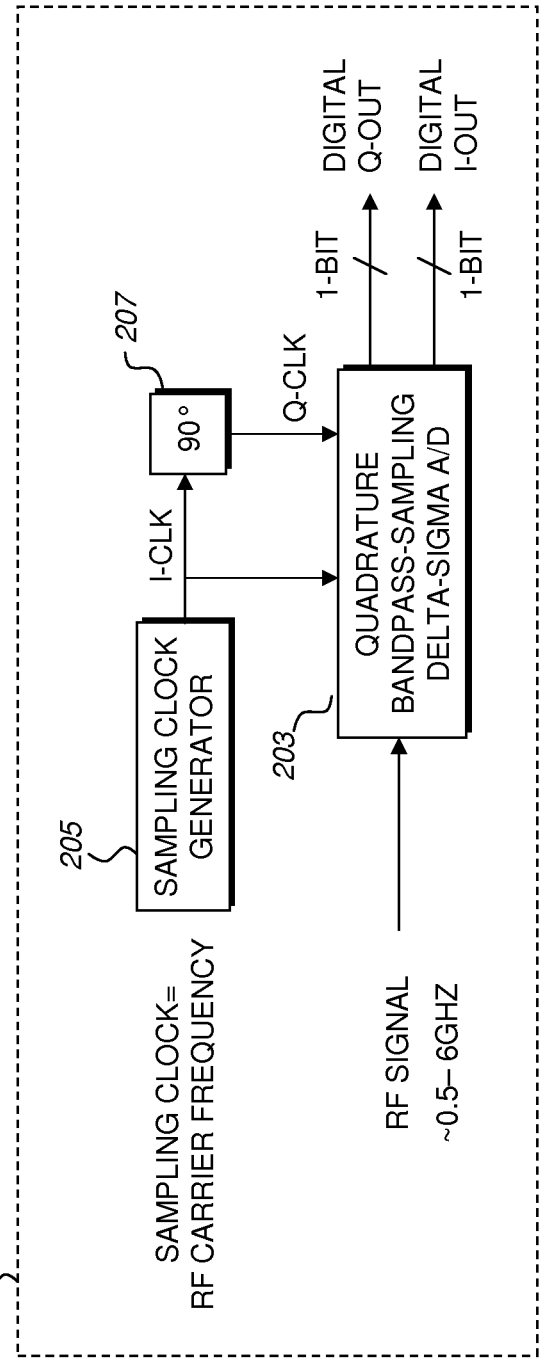
FIG. 2A — CONVENTIONAL ART —

APPARATUS AND METHOD FOR CALIBRATING THE I/Q MISMATCH IN A QUADRATURE BANDPASS SAMPLING RECEIVER

FIELD OF THE INVENTION

The present invention relates to communication receivers, a quadrature bandpass-sampling delta-sigma architecture, and the in-phase and quadrature down conversion in direct-conversion receivers.

BACKGROUND OF THE INVENTION

A delta-sigma modulator or sigma-delta modulator is a feedback system that employs simple circuit blocks to achieve high-resolution output signals. The delta-sigma modulator is widely adapted to electronics circuits such as analog-to-digital converters (A/D), digital-to-analog converters (D/A) or frequency synthesizers, and is highly attractive in wireless communications due to its simplicity and low-power consumption. The radio-frequency (RF) bandpass delta-sigma modulator is one type of delta-sigma modulator that is well adaptable to RF signal reception and subsequent digitization without frequency down conversion.

Advancement in semiconductor process technologies allows usage of the quadrature bandpass-sampling delta-sigma analog-to-digital demodulator (QBS-ADD) at RF frequencies, which is a new promising low-cost and reliable technique to digitize RF signals directly at the antenna. The technology combines the bandpass sampling theory as a direct-conversion technique to demodulate RF signals down to baseband with the continuous-time bandpass delta-sigma technique to increase the A/D conversion resolution.

Because the QBS-ADD is based on the quadrature direct-conversion technique, a phase mismatch in the in-phase (I) and quadrature (Q) sampling clocks can corrupt the demodulated in-phase and quadrature components. A I/Q calibration technique discussed in disclosed embodiments is intended to correct the I/Q phase mismatch based on quantifying the phase error from the demodulated in-phase and quadrature components in the frequency domain.

SUMMARY OF THE INVENTION

The invention features a circuit for correcting the quadrature phase error between the in-phase and quadrature sampling clocks in a quadrature bandpass-sampling receiver comprising: a quadrature bandpass sampling delta-sigma analog-to-digital demodulator (QBS-ADD) configured to receive an in-phase analog test tone and a quadrature analog test tone, combine the in-phase analog test tone and the quadrature analog test tone into a single-sided test tone, demodulate the single-sided test tone to baseband to generate an in-phase digital signal based on the in-phase sampling clock, and generate a quadrature digital signal based on the quadrature sampling clock; a sampling clock generator configured to generate an in-phase sampling clock, having an in-phase sampling clock frequency; a ninety-degree phase shifter configured to receive the in-phase sampling clock, and generate a quadrature sampling clock based on the phase-shift control signal; a discrete Fourier transform (DFT) block configured to receive N samples of the in-phase digital signal to generate an in-phase complex Fourier coefficient, and receive N samples of the quadrature digital signal to generate a quadrature complex Fourier coefficient; an integrator configured to average M samples of the in-phase complex Fourier coefficient to generate a low-noise in-phase coefficient based on the symbol clock, and average M samples of the quadrature complex Fourier coefficient to generate a low-noise quadrature coefficient based on the symbol clock; a symbol clock generator configured to generate a symbol clock, having a symbol clock frequency; an I/Q mismatch calculator configured to receive the low-noise in-phase coefficient and the low-noise quadrature coefficient, and generate a phase-shift control signal; a test tone generator configured to generate an in-phase test tone having an in-phase test tone frequency, and a quadrature test tone; a first multiplier configured to multiply the in-phase test tone with the in-phase sampling clock to generate an up-converted in-phase test tone; a second multiplier configured to multiply the quadrature test tone with the quadrature sampling clock to generate an up-converted quadrature test tone; a first D/A converter configured to receive the up-converted in-phase test tone to generate a in-phase analog test tone; a second D/A converter configured to receive the up-converted quadrature test tone to generate a quadrature analog test tone; wherein N is a positive integer, and M is between 1 and 100; wherein the in-phase sampling clock frequency is N times the symbol clock frequency, N being between 1000 and 500,000; wherein the in-phase sampling clock frequency is between 0.5 GHz to 6 GHz, the quadrature sampling clock has the same frequency as the in-phase sampling clock, the quadrature sampling clock is approximately ninety degree out of phase with respect to the in-phase sampling clock, and the in-phase and quadrature clocks are bi-level clock signals; the in-phase test tone and the quadrature test tone are exactly ninety degree out of phase, the in-phase test one and the quadrature test tone have the same frequency, the in-phase and quadrature test tone frequency is less than 50 MHz, the in-phase sampling clock frequency is an integer multiple of the in-phase test tone frequency, and the in-phase and quadrature test tones are bi-level clock signals; wherein the phase difference between the low-noise in-phase coefficient and the low-noise quadrature coefficient being less than ninety degrees results in increasing the phase shift control signal, the phase difference between the low-noise in-phase coefficient and the low-noise quadrature coefficient being larger than ninety degrees results in decreasing the phase shift control signal, and the absolute value of 90 degrees minus the phase difference between the low-noise in-phase coefficient and the low-noise quadrature coefficient, being less than 0.03 degrees, results in no change in the phase shift control signal.

The QBS-ADD further comprises first through $(K-1)^{th}$ summers, the $i^{th}$ summer being configured to receive the $i^{th}$ in-phase analog signal, the $i^{th}$ quadrature analog signal and the $(i+1)^{th}$ amplified error signal, generate an $i^{th}$ error signal, $i^{th}$ being from first through $(K-1)^{th}$; a $K^{th}$ summer configured to receive an input RF signal and the $K^{th}$ in-phase and quadrature analog signals, generate a $K^{th}$ error signal; first through $K^{th}$ resonators, the $i^{th}$ resonator being configured to receive the $i^{th}$ error signal, generate an $i^{th}$ amplified error signal, $i^{th}$ being from first through $K^{th}$; a first quantizer configured to receive the first amplified error signal based on the in-phase sampling clock, generate an in-phase digital signal; a second quantizer configured to receive the first amplified error signal based on the quadrature sampling clock, generate a quadrature digital signal; first through $K^{th}$ in-phase digital multipliers configured to multiply the in-phase digital signal with the in-phase sampling clock to generate a first through $K^{th}$ up-converted in-phase signal; first through $K^{th}$ quadrature digital multipliers configured to multiply the quadrature digital signal with the quadrature sampling clock to generate a first through $K^{th}$ up-converted quadrature signal; first through $K^{th}$ in-phase D/A converters configured to receive the first through $K^{th}$ up-converted in-phase signal, and generate first through $K^{th}$ in-phase analog signal; first through $K^{th}$ quadrature D/A converters configured to receive the first through $K^{th}$ up-converted quadrature signals, and generate first through $K^{th}$ quadrature analog signals; wherein the in-phase digital signal and the quadrature digital signal are bi-level signals; wherein the first through $K^{th}$ in-phase D/A converters are single-bit converters; wherein the first through $K^{th}$ quadrature D/A converters are single-bit converters; wherein K is between 2 and 4; wherein only one of the first through $K^{th}$ summers is further configured to receive a single-sided test tone; wherein the single-sided test tone frequency is higher than the in-phase sampling clock frequency, the difference between the single-sided test tone frequency and the in-phase sampling clock frequency is less than 50 MHz; wherein the single-sided test tone frequency is lower than the in-phase sampling clock frequency, the difference between the single-sided test tone frequency and the in-phase sampling clock frequency is less than 50 MHz.

The invention also features a method for correcting the quadrature phase error between the in-phase and quadrature sampling clocks in a quadrature bandpass-sampling receiver comprising: receiving an in-phase analog test tone and a quadrature analog test tone; combining the in-phase analog test tone and the quadrature analog test tone into a single-sided test tone; demodulating the single-sided test tone to baseband to generate an in-phase digital signal based on the in-phase sampling clock, and generate a quadrature digital signal based on the quadrature sampling clock; generating an in-phase sampling clock having an in-phase sampling clock frequency; generating a quadrature sampling clock from the in-phase sampling clock based on the phase-shift control signal; capturing N samples of the in-phase digital signal to generate an in-phase complex Fourier coefficient; capturing N samples of the quadrature digital signal to generate a quadrature complex Fourier coefficient; averaging M samples of the in-phase complex Fourier coefficient based on the symbol clock to generate a low-noise in-phase coefficient; averaging M samples of the quadrature complex Fourier coefficient based on the symbol clock to generate a low-noise quadrature coefficient; generating a symbol clock having a symbol clock frequency; generating a phase-shift control signal based on the low-noise in-phase coefficient and the low-noise quadrature coefficient generating an in-phase test tone and a quadrature test tone; multiplying the in-phase test tone with the in-phase sampling clock to generate an up-converted in-phase test tone; multiplying the quadrature test tone with the quadrature sampling clock to generate an up-converted quadrature test tone; D/A converting the up-converted in-phase test tone to a in-phase analog test tone; D/A converting the up-converted quadrature test tone to a quadrature analog test tone; wherein N is a positive integer, and M is between 1 and 100; wherein the in-phase sampling clock frequency is N times the symbol clock frequency, N being between 1000 and 500,000; wherein the in-phase sampling clock frequency is between 0.5 GHz to 6 GHz, the quadrature sampling clock has the same frequency as the in-phase sampling clock, the quadrature sampling clock is approximately ninety degree out of phase with respect to the in-phase sampling clock, and the in-phase and quadrature clocks are bi-level clock signals; wherein the in-phase test tone and the quadrature test tone are exactly ninety degree out of phase, the in-phase test tone and the quadrature test tone have the same frequency, the in-phase and quadrature test tone frequency is less than 50 MHz, the in-phase sampling clock frequency is an integer multiple of the in-phase test tone frequency, and the in-phase and quadrature test tones are bi-level clock signals; wherein the phase difference between the low-noise in-phase coefficient and the low-noise quadrature coefficient being less than ninety degrees results in increasing the phase shift control signal, the phase difference between the low-noise in-phase coefficient and the low-noise quadrature coefficient being larger than ninety degrees results in decreasing the phase shift control signal, and the absolute value of 90 degrees minus the phase difference between the low-noise in-phase coefficient and the low-noise quadrature coefficient, being less than 0.03 degrees, results in no change in the phase shift control signal.

Furthermore, demodulating the single-sided test tone to baseband further comprises combining the first through $(K-1)^{th}$ in-phase analog signal, the first through $(K-1)^{th}$ quadrature analog signal and the second through $K^{th}$ amplified error signal to generate a first through $(K-1)^{th}$ error signal; combining the $K^{th}$ in-phase and quadrature analog signals to generate a $K^{th}$ error signal; amplifying the first through $K^{th}$ error signal to generate a first through $K^{th}$ amplified error signal; receiving the first amplified error signal based on the in-phase sampling clock to generate an in-phase digital signal; receiving the first amplified error signal based on the quadrature sampling clock to generate a quadrature digital signal; generating first through $K^{th}$ up-converted in-phase signals based on first through $K^{th}$ multiplications of the in-phase digital signal with the in-phase sampling clock; generating first through $K^{th}$ up-converted quadrature signals based on first through $K^{th}$ multiplications of the quadrature digital signal with the quadrature sampling clock; D/A converting first through $K^{th}$ up-converted in-phase signals to generate first through $K^{th}$ in-phase analog signals; D/A converting first through $K^{th}$ up-converted quadrature signals to generate first through $K^{th}$ quadrature analog signals; wherein the in-phase digital signal and the quadrature digital signal are bi-level signals; wherein D/A conversion is a single-bit conversion; wherein K is between 2 and 4.

Also, demodulating the single-sided test tone to baseband allows adding a single-ended test tone to only one of first through $K^{th}$ error signal; wherein the single-sided test tone frequency is higher than the in-phase sampling clock frequency, the difference between the single-sided test tone frequency and the in-phase sampling clock frequency is less than 50 MHz; wherein the single-sided test tone frequency is lower than the in-phase sampling clock frequency, the difference between the single-sided test tone frequency and the in-phase sampling clock frequency is less than 50 MHz.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

FIG. 1A is a frequency diagram illustrating quadrature down conversion to baseband based on the bandpass-sampling theory;

FIG. 1B is a timing diagram illustrating quadrature down conversion to baseband based on the bandpass-sampling theory;

FIG. 2A is a schematic diagram illustrating a conventional quadrature bandpass-sampling RF receiver;

DETAILED DESCRIPTION

Figure 2B:
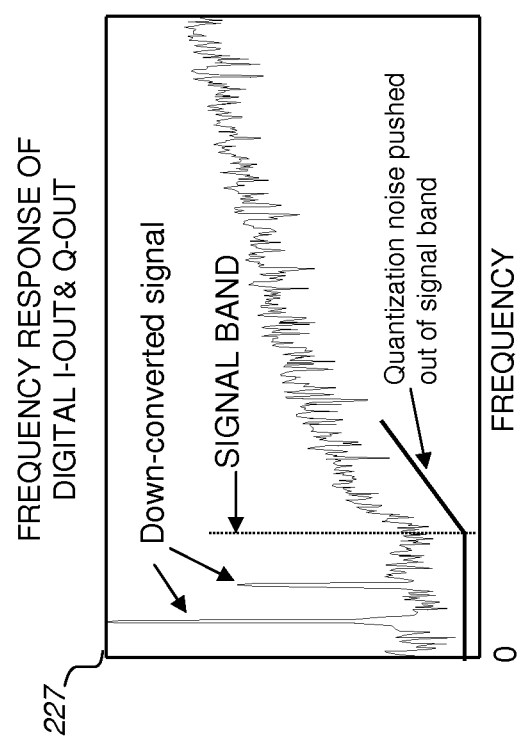
FIG. 2B is a frequency diagram illustrating the in-phase and quadrature frequency spectrums at baseband.

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Referring now to FIG. 1A, frequency diagrams 103, 105, and 107 illustrate quadrature down conversion of an RF signal to the baseband frequency based on the bandpass-sampling theory. A communication transmitter is employed to modulate the information to a carrier frequency, $f_c$, and transmit the RF signal over the air. For example, conventional cellular phone carrier frequencies are currently set at either 900 MHz or 1800 MHz. In quadrature modulation, two independent data streams, A(t) and B(t), are modulated by $\cos(w_c t)$ and $\sin(w_c t)$, respectively. The combined $A(t)\cos(w_c t) - B(t)\sin(w_c t)$ is then transmitted over the air. In the frequency domain, the transmitted information 109 in the frequency diagram 103 can be seen centered at the carrier frequency, $f_c$, where the width of the shaped object corresponds to the bandwidth of the transmitted information. Note that the transmitted object is mirrored to the negative frequencies along the zero-frequency axis.

Referring now to FIG. 1B, the timing diagram 111 illustrates a sinusoidal waveform 131 at the RF carrier frequency. The in-phase, A(t), and quadrature, B(t) signals which carry the communicating information modulate slowly the amplitude and/or the phase of the sinusoidal waveform 131, depending on the modulation scheme employed in the communication system. In a quadrature bandpass-sampling receiver, the sampling rate is set equal to the RF carrier frequency, $f_c$, and only two respective sampled data points for every period of the RF carrier are captured, as shown in the timing diagram 111. The first sequence of sampled data points $I_1, I_2, \ldots, I_N$ corresponds to the in-phase (I) sequence while the second sequence of sampled data points $Q_1, Q_2, \ldots, Q_N$ corresponds to the quadrature (Q) sequence. Note that the time duration in between two adjacent sampled points of each sequence is always, $$\frac{1}{f_C},$$

the RF carrier period, and the time duration between a Q sampled point and an adjacent I sampled point is always, $$\frac{1}{4 f_C},$$

or one quarter of the RF carrier period.

Bandpass sampling the sinusoidal waveform 131 removes the high frequency RF waveform and captures only the slowly-varying amplitude and/or phase of the communicating information that were modulated to the RF carrier frequency. By virtue of the bandpass sampling theory, the in-phase and quadrature modulated signals are down-converted to baseband, or dc, as illustrated in the frequency diagram 105 of FIG. 1A. The sampled I and Q sequences can be recombined, according to I±jQ (where j denotes the complex number notation), to re-construct the transmitted A(t) and B(t) signals as in the frequency diagram 107.

However, under a non-ideal scenario, the phase mismatch and gain mismatch between the in-phase sampling and the quadrature sampling can cause imperfect image cancellation as shown in the frequency diagram 107. Since $\sin(w_c t)$ and $\cos(w_c t)$ are orthogonal, A(t) and B(t) can be fully recovered ideally by quadrature bandpass sampling. However, a gain difference between the I-sampling and the Q-sampling can cause imperfect image cancellation. Also, a phase error between the I-sampling and the Q-sampling from $$\frac{1}{4 f_C}$$

can result in a residual image. The residual image is seen as a leakage of A(t) onto B(t) while sampling B(t) and vice versa; therefore, orthogonality is destroyed resulting in reduced signal-to-noise ratio (SNR) and higher bit error rate (BER).

Referring now to FIG. 2A, a schematic diagram 201 illustrating a conventional quadrature bandpass-sampling receiver is discussed. The quadrature bandpass-sampling receiver 201 comprises a sampling clock generator 205, a 90-degree phase shifter 207, and the quadrature bandpass-sampling delta sigma analog-to-digital demodulator (QBS-ADD) 203. The sampling clock generator 205 generates an in-phase sampling clock (I-CLK), whose frequency is set equal to the carrier frequency of the input RF signal. The 90-degree phase shifter 207 phase-shifts I-CLK by 90 degrees and produces the quadrature sampling clock, Q-CLK. The RF signal, whose center frequency is located between 0.5 GHz and 6 GHz, is bandpass-sampled by the QBS-ADD 203 based on I-CLK and Q-CLK. The communicating in-phase and quadrature information embedded in the RF signal are then demodulated to baseband, and the corresponding digital I-OUT and Q-OUT signals are generated, respectively, at a sampling rate equal to I-CLK.

FIG. 2B is a frequency diagram which illustrates the typical spectrum profile of the QBS-ADD 203 digital outputs, I-OUT and Q-OUT. Unlike other conventional RF receivers where the in-phase and quadrature demodulated signals are digitized by a pair of A/Ds at high-resolution and low sampling rate, the QBPS-ADD 203 is a delta-sigma type converter, which produces a stream of bi-level digital I-OUT and Q-OUT signals clocked at a sample rate equal to the RF signal carrier frequency. Even though I-OUT and Q-OUT have noise-like characteristics, the noise-shaping property of oversampling delta-sigma modulator pushes the quantization noise to higher frequencies and leaves the signal band at baseband with minimum amount of quantization noise. The frequency diagram 227 illustrates the spectrum profile of typical I-OUT and Q-OUT signals. Even though I-OUT and Q-OUT have only 1-bit resolution, the quantization noise is pushed out of the signal band, providing high-resolution I-OUT and Q-OUT. Typically, the signal bandwidth at baseband is between 5 MHz to 50 MHz, which is half of the pass band of the QBS-ADD centered at the RF signal carrier frequency.

Figure 3:
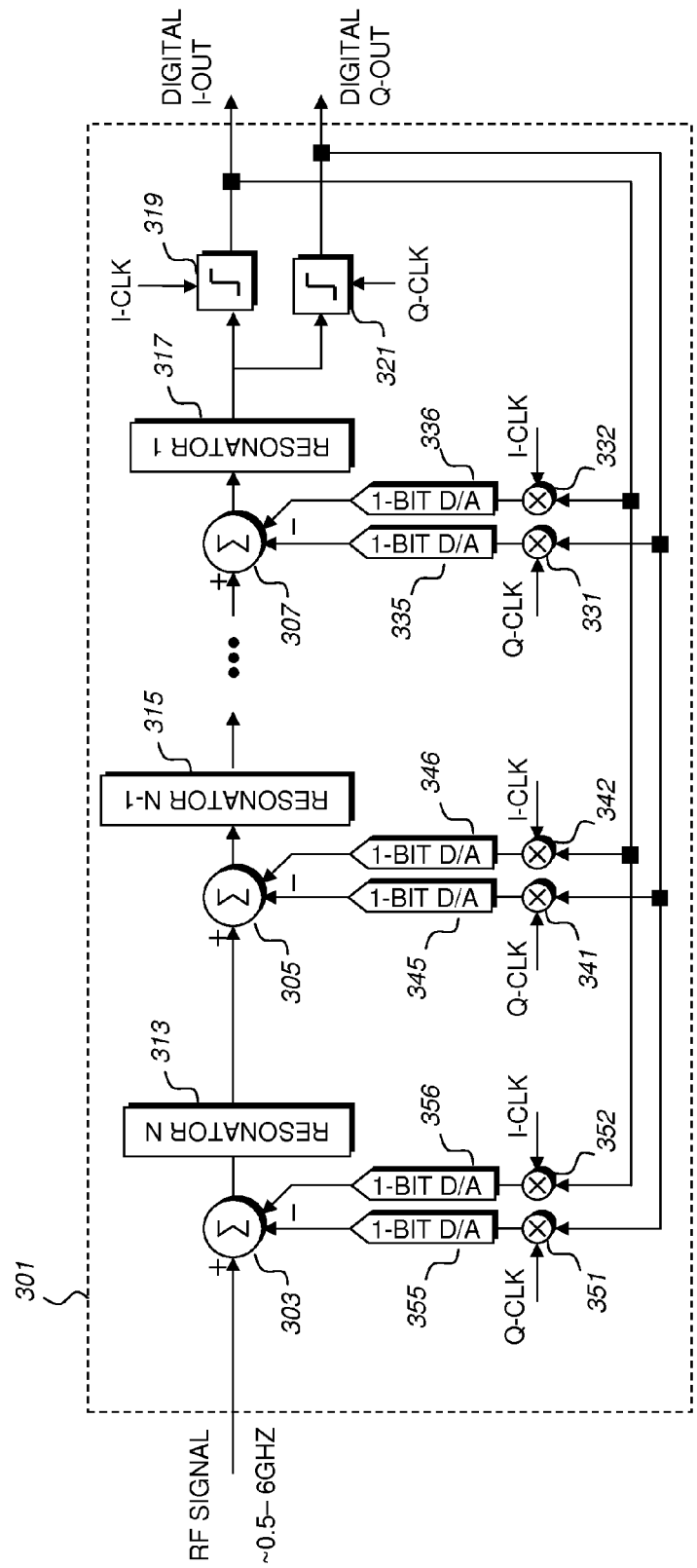
FIG. 3 is a schematic diagram illustrating a conventional quadrature bandpass sampling delta-sigma analog-to-digital demodulator.

Referring now to FIG. 3, a schematic diagram 301 illustrating a conventional architecture of the QBS-ADD 203 in FIG. 2A will be discussed. The QBS-ADD architecture 301 comprises a plurality of resonators 313, 315, 317 connected in cascade; two single-bit quantizers 319 and 321; a plurality of summers 303, 305, 307; a plurality of single-bit digital-to-analog converters (D/A) 335, 336, 345, 346, 355, 356; and a plurality of digital multipliers 331, 332, 341, 342, 351, and 352.

In general, the QBS-ADD architecture 301 is a multi-stage feedback architecture, in which the feedback tap points are provided by the pair D/As (355, 356), (345, 346) and (335, 336). The resonators 313, 315 and 317 form a high-gain bandpass filter which provides bandpass filtering and amplification of the error signals produced by the summers 303, 305, and 307, respectively. The summer 303 subtracts the feedback information from the D/As 355 and 356 from the RF signal to produce the first error signal. Each resonator can be constructed from an inductor, L, and a capacitor, C, both of which form a resonance at $$\frac{1}{\sqrt{LC}}.$$

Each resonator is required to have a high quality factor (Q-factor) to produce high gain for amplification. All the resonators 313, 315, and 317 resonant frequencies are set close to each other to form a bandpass filter with the passband centered about the RF signal carrier frequency. The passband bandwidth of the bandpass filter is usually set from 5 MHz to 100 MHz, wide enough to encompass the RF signal bandwidth. The order of a bandpass delta-sigma modulator relates to the number of resonators. For example, a second-order bandpass delta-sigma modulator comprises one LC resonator, or one L and one C; whereas an eighth-order modulator comprises four LC resonators. High-order bandpass delta-sigma modulators are characterized by excessive phase shifts in the bandpass filter; and therefore, are difficult to stabilize due to their feedback characteristic. Nevertheless, fourth-order to eighth-order modulators can be stabilized easily and are adequate to achieve high-resolution A/D quantization to meet various current wireless standard requirements.

The single-bit quantizers 319 and 321 provide bandpass sampling and down-conversion of the RF signal to baseband. The quantizers 319 and 321 are clocked by the in-phase sampling clock, I-CLK, and the quadrature sampling clock, Q-CLK, respectively. The quantizer 319 generates the bi-level digital output, I-OUT, which contains the in-phase component down-converted to baseband. The quantizer 321 generates the bi-level digital output, Q-OUT, which contains the quadrature component down-converted to baseband.

Because the RF signal is demodulated to baseband by the quantizers 319 and 321, by virtue of the bandpass sampling theory, it is fundamentally necessary to up-convert the demodulated signals, I-OUT and Q-OUT, as feedback signals to fulfill the feedback requirement—i.e. the feedback signals must be modulated by the same frequency as the input RF signal so that the correct error signals can be generated at the summing junctions 303, 305 and 307. This requirement dictates inclusion of the feedback multipliers 331, 341, 351 to up-convert Q-OUT using Q-CLK, and the feedback multipliers 332, 342 and 352 to up-convert I-OUT using I-CLK to the RF signal frequency. Since I-CLK, Q-CLK, I-OUT, and Q-OUT are all bi-level signals, the multipliers 331, 332, 341, 342, 351, and 352 are single-bit multiplication. Consequently, only single-bit D/As 335, 336, 345, 346, 355, and 356 are needed.

As discussed earlier, gain and phase mismatch in the in-phase and quadrature samplings can cause imperfect image cancellation. For the QBS-ADD architecture 301, the gain mismatch can arise from the mismatch between pairs of D/As, each of which comprises a quadrature D/A and an in-phase D/A; namely, D/A pairs (335, 336), (345, 346), and (355, 356). Nevertheless, the 1-bit D/A can be designed efficiently to size the gain mismatch below 0.1%, at which the residual image due to imperfect cancellation is negligible. However, at RF frequencies between 0.5 GHz to 6 GHz, generating the in-phase and quadrature sampling clocks which are separated by exactly 90 degrees is more problematic. Mathematical analyses have shown that phase errors from the nominal 90 degrees can only be tolerable if they are below 0.03 degrees—a number which is hard to achieve in the current semiconductor process technologies. Therefore, calibrating the phase error between the in-phase and quadrature sampling clocks is needed to minimize the residual image arising from imperfect cancellation from the digitized I-OUT and Q-OUT.

Figure 4:
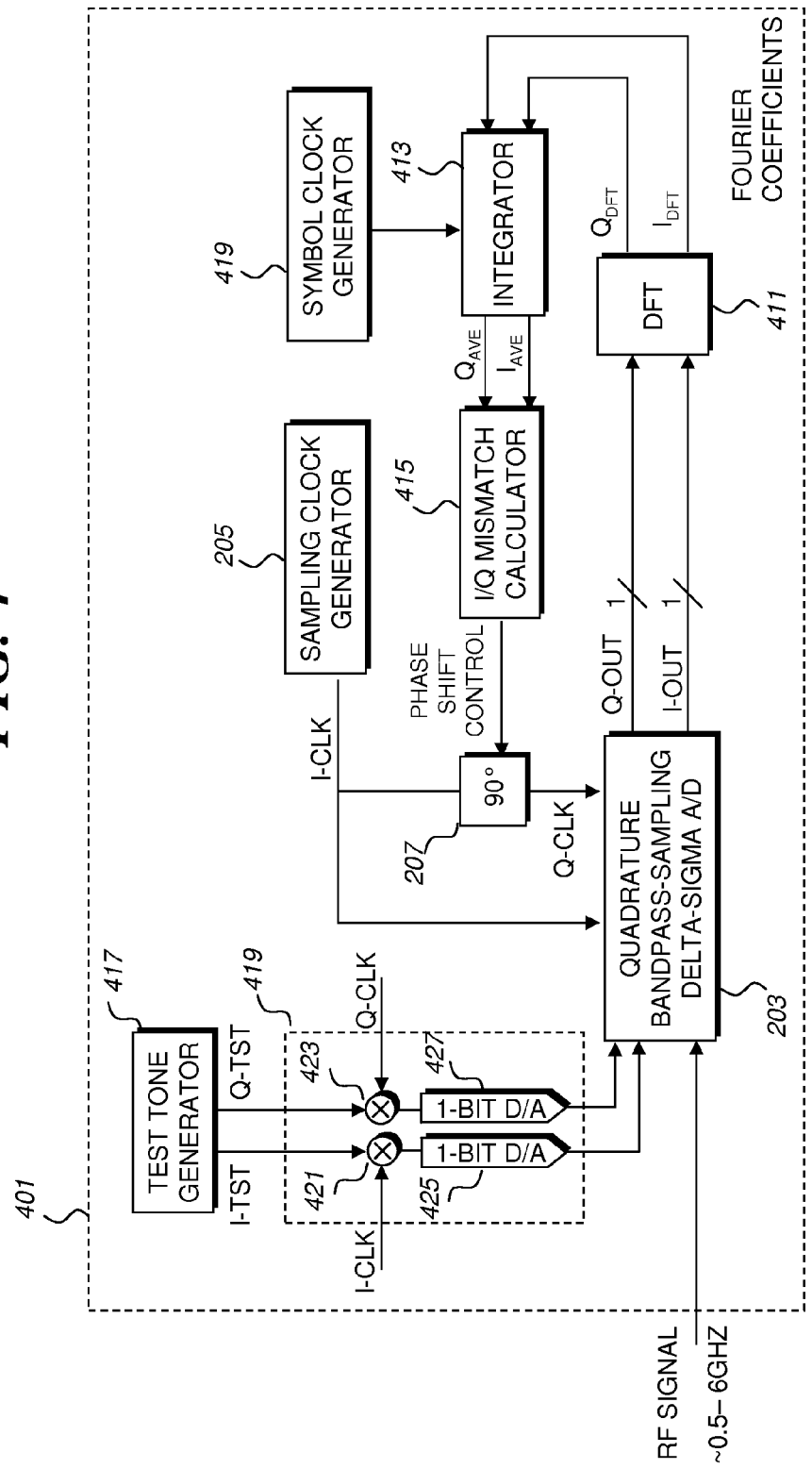
FIG. 4 is a schematic diagram illustrating an exemplary in-phase and quadrature sampling clock calibrating architecture according to disclosed embodiments.

Referring now to FIG. 4, a schematic diagram illustrating an exemplary I/Q phase mismatch calibrator 401 in accordance with one or more embodiments will be discussed and described. The calibrator 401 comprises the QBS-ADD 203, the sampling clock generator 205, the 90-degree phase shifter 207, the Discrete Fourier Transform (DFT) 411, the integrator 413, the symbol clock generator 419, the I/Q mismatch calculator 415, the test tone generator 417, and the quadrature modulator 419, which further comprises a pair of multipliers 421, 423 and a pair of 1-bit D/As 425 and 427.

The calibrator 401 extracts the phase error information from the QBS-ADD 203 outputs, I-OUT and Q-OUT in the frequency domain, and uses it to correct the phase shift between the in-phase sampling clock, I-CLK, and the quadrature sampling clock, Q-CLK. First, an in-phase test tone, I-TST, and a quadrature test tone, Q-TST are generated from the test tone generator 417. I-TST and Q-TST are exactly 90 degree out of phase, as they are digitally generated. The test tone is essentially a clock, whose frequency is set lower than 50 MHz, so that the up-converted test tone will be within the pass band of the QBS-ADD 203. The quadrature modulator 419 is used to up-convert I-TST and Q-TST to the RF input frequency using the sampling clocks, I-CLK and Q-CLK. The up-converted I and Q test tones will be combined in the QBS-ADD 203 to generate a single-sided test tone near the RF carrier frequency, $f_c$. Note that the single-sided test tone can be set either above or below $f_c$, but no more than 50 MHz away from $f_c$ by virtue of quadrature modulation theory.

Next, the QBS-ADD 203 bandpass samples the single-sided test tone using I-CLK and Q-CLK to generate a down-converted in-phase test tone in I-OUT and a down-converted quadrature test tone in Q-OUT, respectively. Note that I-OUT should carry the same tone as I-TST, while Q-OUT should carry the same tone as Q-TST, except that I-OUT and Q-OUT are not exactly 90 degree out of phase due to the phase mismatch between I-CLK and Q-CLK.

The phase error can be extracted in the frequency domain using the Discrete Fourier Transform. N samples of I-OUT and Q-OUT, between 1,000 to 500,000 samples, are collected and used by the DFT 411 to generate the in-phase complex Fourier coefficient, $I_{DFT}$, and the quadrature complex Fourier coefficient, $Q_{DFT}$, respectively. Note that the sampling frequency of I-CLK and Q-CLK, must be an integer multiple of the test tone frequency so that the test tone is properly placed in the frequency bin after the Discrete Fourier Transform and inter-bin spectral leakage due to the DFT can be avoided. The symbol clock frequency, generated by the symbol clock generator 419, is set at N times lower than the in-phase sampling clock and is used to trigger the integrator 413 to sample the DFT 411 output at the end of the DFT transformation. The integrator 413 is used to average M samples of $Q_{DFT}/I_{DFT}$ to reduce the noise level and increase the signal-to-noise ratio according to:

$$I_{AVE} = \frac{1}{M}\sum_{i=1}^{M} I_{DFT}(i), \text{ and } Q_{AVE} = \frac{1}{M}\sum_{i=1}^{M} Q_{DFT}(i),$$

where M is set between 1 to 100 averages.

Finally, the I/Q mismatch calculator 415 extracts the phase difference between $Q_{AVE}$ and $I_{AVE}$, compares to 90 degrees, and generates a phase shift control to the 90-degree phase shifter 207. A phase difference below 90 degrees results in a negative phase error and causes an increase in the phase shift control, while a phase difference above 90 degrees results in a positive phase error and causes a decrease in the phase shift control. The calibrating process loops until the resulting phase error is less than 0.03 degrees from the nominal 90 degree phase shift.

Figure 5A:
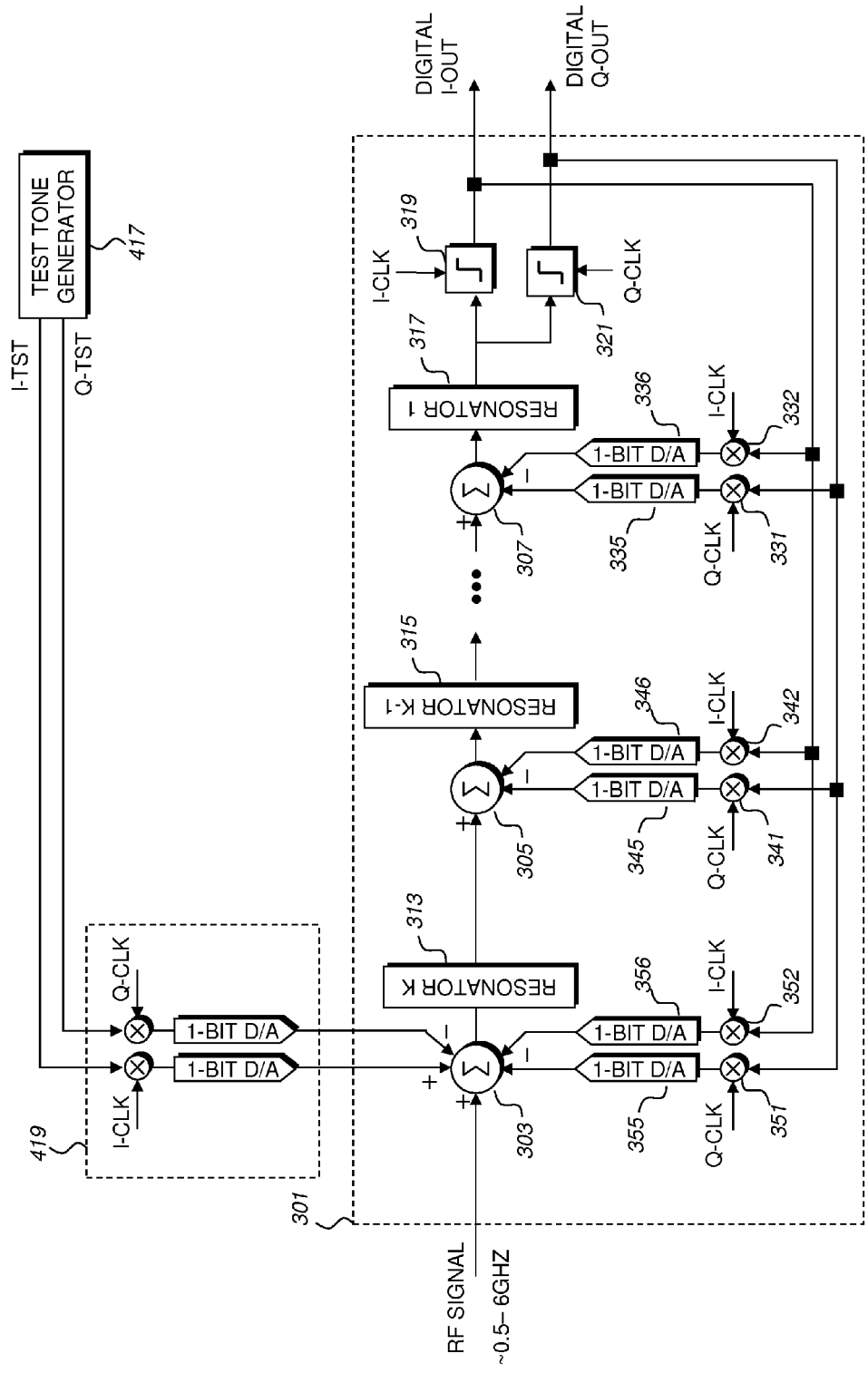
FIG. 5A is a schematic diagram illustrating an exemplary test tone injection technique according to disclosed embodiments.

Referring now to FIG. 5A, a schematic diagram illustrating an exemplary test tone injection into the QBS-ADD 301 in accordance with one or more embodiments will be discussed and described. The quadrature modulator 419 up-converts the in-phase test tone, I-TST, and the quadrature test tone, Q-TST, to the RF signal frequency. The up-converted test tones can be combined at the summer 303 into a single-sided test tone on either side of the RF signal carrier frequency, which is the same as the in-phase sampling clock (I-CLK) frequency. The injected test tone at the summer 303, which is an input to the QBS-ADD 301, will be demodulated back down to baseband by the in-phase sampling clock, I-CLK, and the quadrature sampling clock, Q-CLK.

Figure 5B:
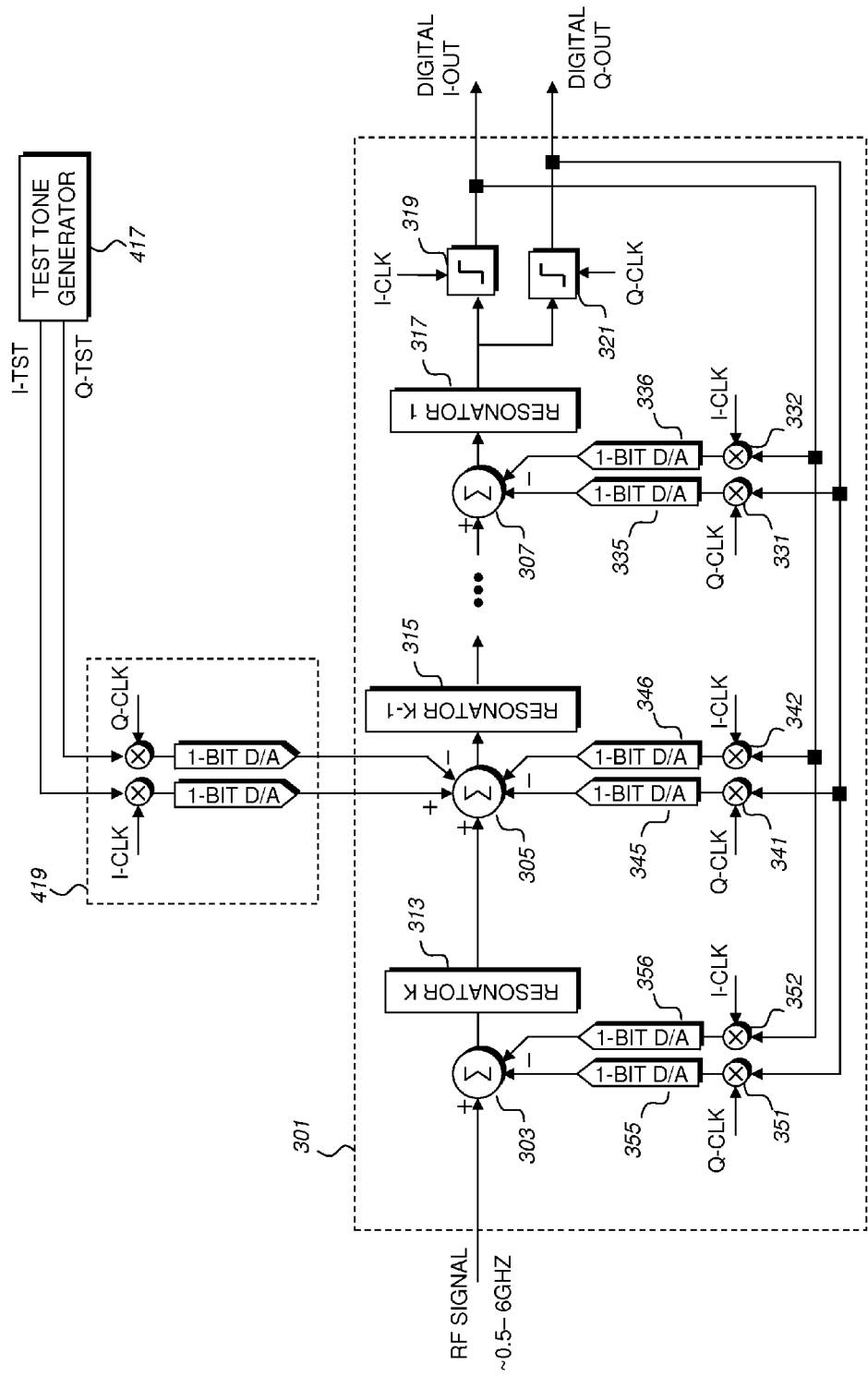
FIG. 5B is a schematic diagram illustrating an alternative exemplary test tone injection technique according to disclosed embodiments.

Referring now to FIG. 5B, a schematic diagram illustrating an alternative exemplary test tone injection into the QBS-ADD 301 in accordance with one or more embodiments will be discussed and described. The up-converted test tones generated by the quadrature modulator 419 are injected at the summer 305. Because the test tones are injected at the summer 305, according to feedback control theory, the down-converted test tones at the output of the QBS-ADD 301 will experience an attenuation equivalent to the gain of the resonator K 313.

Figure 5C:
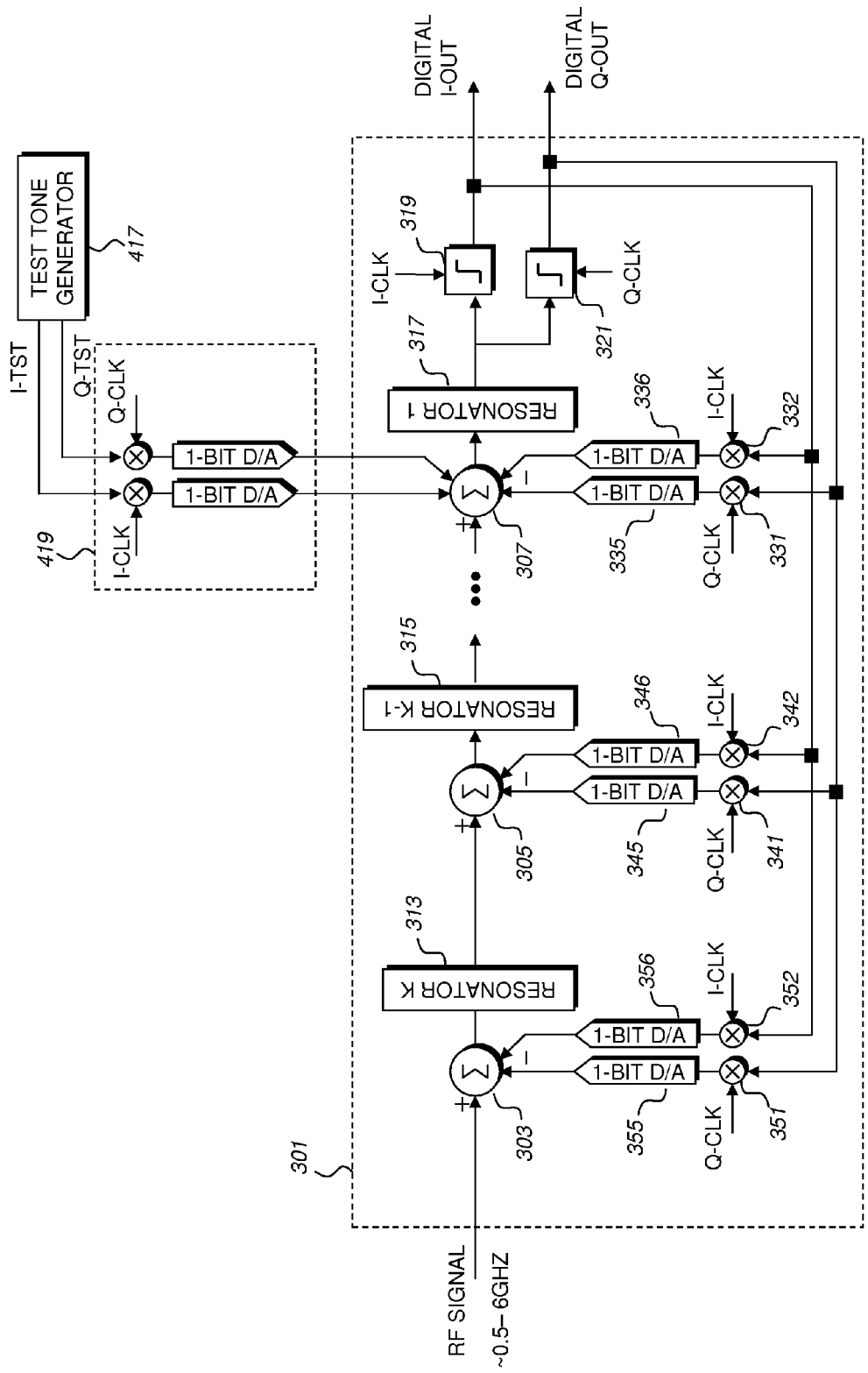
FIG. 5C is a schematic diagram illustrating an alternative exemplary test tone injection technique according to disclosed embodiments.

Referring now to FIG. 5C, a schematic diagram illustrating an alternative exemplary test tone injection into the QBS-ADD 301 in accordance with one or more embodiments will be discussed and described. The up-converted test tones generated by the quadrature modulator 419 are injected at the summer 307. Because the test tones are injected toward the end of the bandpass filter chain containing resonators 313, 315, and 317, according to feedback control theory, the down-converted test tones at the output of the QBS-ADD 301 will experience an attenuation equivalent to the combined gain from all the resonators before the summer 307, including resonator 2 (not shown in the figure), resonator (K−1) 315, and resonator K 313.

Figure 6:
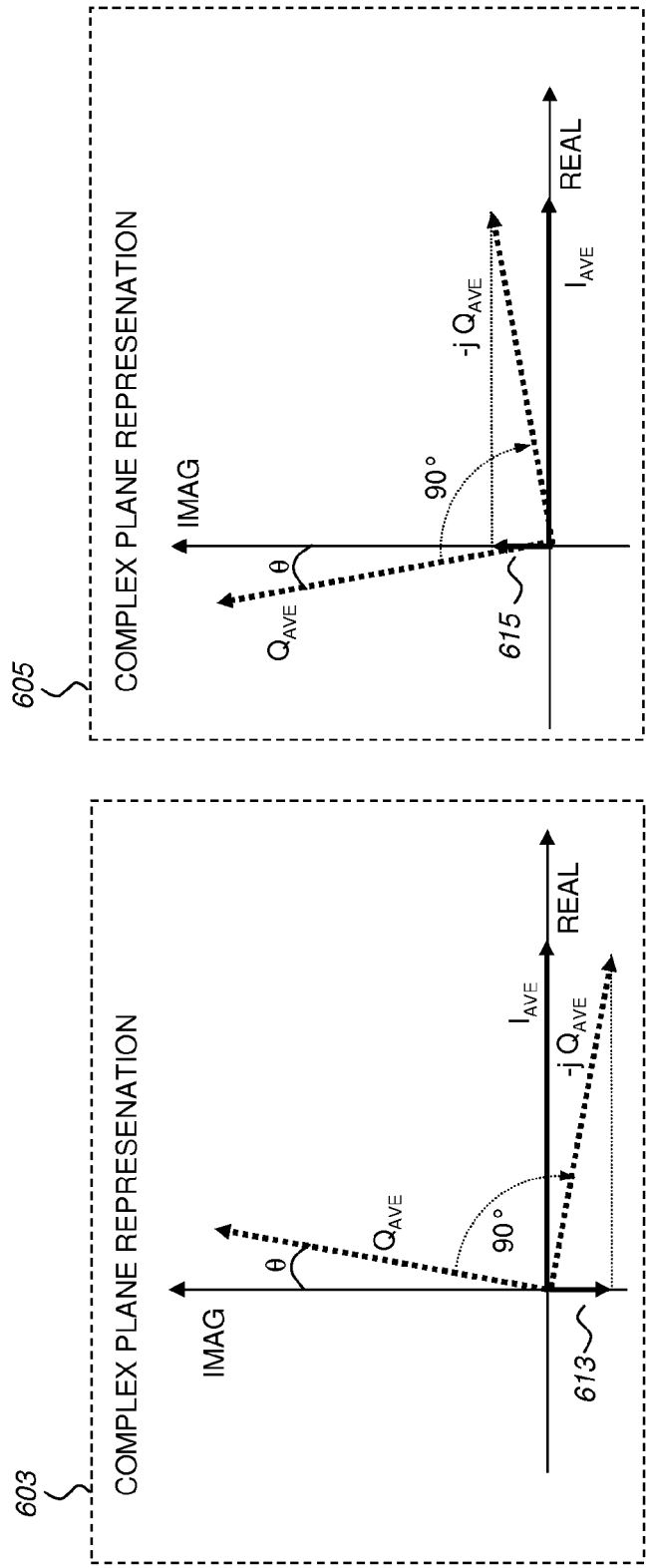
FIG. 6 is a complex plane diagram illustrating effects of the I/Q phase mismatch.

Referring now to FIG. 6, two complex plane diagrams 603 and 605 illustrating the effect of I/Q phase mismatch will be discussed. From FIG. 4, the I-OUT and Q-OUT from the QBS-ADD 203 are converted to the frequency domain by the DFT 411, and the complex phasors $I_{DFT}$ and $Q_{DFT}$ are generated, respectively. The integrator 413 filters the noise in $I_{DFT}$ and $Q_{DFT}$ to produce $I_{AVE}$ and $Q_{AVE}$, respectively. The complex plane diagram 603 illustrates the complex phasors $I_{AVE}$ and $Q_{AVE}$ when the phase difference between I-CLK and Q-CLK is less than 90 degrees, wherein θ denotes the phase error from the 90 degree reference. The original test tone is re-produced by generating the component $I_{AVE}$−j $Q_{AVE}$, wherein the −j operator performs a 90 degree rotation of $Q_{AVE}$ in the clockwise direction. Since $Q_{AVE}$ is not aligned with the imaginary axis, the −j $Q_{AVE}$ phasor creates a residual image component 613 on the imaginary axis. Likewise, the complex plane diagram 605 illustrates $I_{AVE}$ and $Q_{AVE}$ when the phase difference between I-CLK and Q-CLK is larger than 90 degrees. Since $Q_{AVE}$ is not aligned with the imaginary axis, the −j $Q_{AVE}$ phasor creates a residual image component 615 on the imaginary axis. The I/Q mismatch calculator 415 in FIG. 4 extracts the phase error information, θ, from the complex phasor $I_{AVE}$ and $Q_{AVE}$, and updates the phase-shift control signal accordingly.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for correcting the quadrature phase error between the in-phase and quadrature sampling clocks in a quadrature bandpass-sampling receiver comprising:
   a quadrature bandpass sampling delta-sigma analog-to-digital demodulator (QBS-ADD) configured to
      receive an in-phase analog test tone and a quadrature analog test tone,
      combine the in-phase analog test tone and the quadrature analog test tone into a single-sided test tone, and
      demodulate the single-sided test tone to baseband to
         generate an in-phase digital signal based on the in-phase sampling clock, and
         generate a quadrature digital signal based on the quadrature sampling clock;
   a sampling clock generator configured to generate an in-phase sampling clock, having an in-phase sampling clock frequency;
   a ninety-degree phase shifter configured to
      receive the in-phase sampling clock, and
      generate a quadrature sampling clock based on the phase-shift control signal;
   a discrete Fourier transform (DFT) block configured to
      receive N samples of the in-phase digital signal to generate an in-phase complex Fourier coefficient, and
      receive N samples of the quadrature digital signal to generate a quadrature complex Fourier coefficient;
   an integrator configured to
      average M samples of the in-phase complex Fourier coefficient to generate a low-noise in-phase coefficient based on the symbol clock, and
      average M samples of the quadrature complex Fourier coefficient to generate a low-noise quadrature coefficient based on the symbol clock;
   a symbol clock generator configured to generate a symbol clock, having a symbol clock frequency;
   an in-phase/quadrature (I/Q) mismatch calculator configured to
      receive the low-noise in-phase coefficient and the low-noise quadrature coefficient, and
      generate a phase-shift control signal;
   a test tone generator configured to generate
      an in-phase test tone having an in-phase test tone frequency, and
      a quadrature test tone;
   a first multiplier configured to multiply the in-phase test tone with the in-phase sampling clock to generate an up-converted in-phase test tone;
   a second multiplier configured to multiply the quadrature test tone with the quadrature sampling clock to generate an up-converted quadrature test tone;
   a first digital-to-analog (D/A) converter configured to receive the up-converted in-phase test tone to generate a in-phase analog test tone; and
   a second D/A converter configured to receive the up-converted quadrature test tone to generate a quadrature analog test tone;
   wherein
      N is a positive integer, and
      M is between 1 and 100.

2. The circuit of claim 1, wherein the in-phase sampling clock frequency is N times the symbol clock frequency, N being between 1000 and 500,000.

3. The circuit of claim 1, wherein
   the in-phase sampling clock frequency is between 0.5 GHz to 6 GHz,
   the quadrature sampling clock has the same frequency as the in-phase sampling clock, the quadrature sampling clock is approximately ninety degree out of phase with respect to the in-phase sampling clock, and the in-phase and quadrature clocks are bi-level clock signals.

4. The circuit of claim 1, wherein the in-phase test tone and the quadrature test tone are exactly ninety degree out of phase, the in-phase test one and the quadrature test tone have the same frequency, the in-phase and quadrature test tone frequency is less than 50 MHz, the in-phase sampling clock frequency is an integer multiple of the in-phase test tone frequency, and the in-phase and quadrature test tones are bi-level clock signals.

5. The circuit of claim 1, wherein the phase difference between the low-noise in-phase coefficient and the low-noise quadrature coefficient being less than ninety degrees results in increasing the phase shift control signal, the phase difference between the low-noise in-phase coefficient and the low-noise quadrature coefficient being larger than ninety degrees results in decreasing the phase shift control signal, and the absolute value of 90 degrees minus the phase difference between the low-noise in-phase coefficient and the low-noise quadrature coefficient, being less than 0.03 degrees, results in no change in the phase shift control signal.

6. The circuit of claim 1, wherein the QBS-ADD further comprises:

first through $(K-1)^{th}$ summers, the $i^{th}$ summer being configured to receive the $i^{th}$ in-phase analog signal, the $i^{th}$ quadrature analog signal and the $(i+1)^{th}$ amplified error signal, generate an $i^{th}$ error signal, $i^{th}$ being from first through $(K-1)^{th}$;

a $K^{th}$ summer configured to receive an input RF signal and the $K^{th}$ in-phase and quadrature analog signals, generate a $K^{th}$ error signal;

first through $K^{th}$ resonators, the $i^{th}$ resonator being configured to receive the $i^{th}$ error signal, generate an $i^{th}$ amplified error signal, $i^{th}$ being from first through $K^{th}$;

a first quantizer configured to receive the first amplified error signal based on the in-phase sampling clock, generate an in-phase digital signal;

a second quantizer configured to receive the first amplified error signal based on the quadrature sampling clock, generate a quadrature digital signal;

first through $K^{th}$ in-phase digital multipliers configured to multiply the in-phase digital signal with the in-phase sampling clock to generate a first through $K^{th}$ up-converted in-phase signal;

first through $K^{th}$ quadrature digital multipliers configured to multiply the quadrature digital signal with the quadrature sampling clock to generate a first through $K^{th}$ up-converted quadrature signal;

first through $K^{th}$ in-phase D/A converters configured to receive the first through $K^{th}$ up-converted in-phase signal, and generate first through $K^{th}$ in-phase analog signal; and first through $K^{th}$ quadrature D/A converters configured to receive the first through $K^{th}$ up-converted quadrature signals, and generate first through $K^{th}$ quadrature analog signals;

wherein the in-phase digital signal and the quadrature digital signal are bi-level signals;

wherein the first through $K^{th}$ in-phase D/A converters are single-bit converters;

wherein the first through $K^{th}$ quadrature D/A converters are single-bit converters; and wherein K is between 2 and 4.

7. The circuit of claim 1, wherein the single-sided test tone frequency is higher than the in-phase sampling clock frequency, and the difference between the single-sided test tone frequency and the in-phase sampling clock frequency is less than 50 MHz.

8. The circuit of claim 1, wherein the single-sided test tone frequency is lower than the in-phase sampling clock frequency, and the difference between the single-sided test tone frequency and the in-phase sampling clock frequency is less than 50 MHz.

9. The circuit of claim 6, wherein only one of the first through $K^{th}$ summers is further configured to receive a single-sided test tone.

10. A method for correcting the quadrature phase error between the in-phase and quadrature sampling clocks in a quadrature bandpass-sampling receiver comprising:

receiving an in-phase analog test tone and a quadrature analog test tone;

combining the in-phase analog test tone and the quadrature analog test tone into a single-sided test tone;

demodulating the single-sided test tone to baseband to generate an in-phase digital signal based on the in-phase sampling clock, and generate a quadrature digital signal based on the quadrature sampling clock;

generating an in-phase sampling clock having an in-phase sampling clock frequency;

generating a quadrature sampling clock from the in-phase sampling clock based on the phase-shift control signal;

capturing N samples of the in-phase digital signal to generate an in-phase complex Fourier coefficient;

capturing N samples of the quadrature digital signal to generate a quadrature complex Fourier coefficient;

averaging M samples of the in-phase complex Fourier coefficient based on the symbol clock to generate a low-noise in-phase coefficient;

averaging M samples of the quadrature complex Fourier coefficient based on the symbol clock to generate a low-noise quadrature coefficient;

generating a symbol clock having a symbol clock frequency;

generating a phase-shift control signal based on the low-noise in-phase coefficient and the low-noise quadrature coefficient;

generating an in-phase test tone and a quadrature test tone;

multiplying the in-phase test tone with the in-phase sampling clock to generate an up-converted in-phase test tone;

multiplying the quadrature test tone with the quadrature sampling clock to generate an up-converted quadrature test tone;

digital-to-analog (D/A) converting the up-converted in-phase test tone to a in-phase analog test tone; and D/A converting the up-converted quadrature test tone to a quadrature analog test tone;
wherein
N is a positive integer, and
M is between 1 and 100.

11. The method of claim 10, wherein the in-phase sampling clock frequency is N times the symbol clock frequency, N being between 1000 and 500,000.

12. The method of claim 10, wherein
the in-phase sampling clock frequency is between 0.5 GHz to 6 GHz,
the quadrature sampling clock has the same frequency as the in-phase sampling clock,
the quadrature sampling clock is approximately ninety degree out of phase with respect to the in-phase sampling clock, and
the in-phase and quadrature clocks are bi-level clock signals.

13. The method of claim 10, wherein
the in-phase test tone and the quadrature test tone are exactly ninety degree out of phase,
the in-phase test one and the quadrature test tone have the same frequency,
the in-phase and quadrature test tone frequency is less than 50 MHz,
the in-phase sampling clock frequency is an integer multiple of the in-phase test tone frequency, and
the in-phase and quadrature test tones are bi-level clock signals.

14. The method of claim 10, wherein
the phase difference between the low-noise in-phase coefficient and the low-noise quadrature coefficient being less than ninety degrees results in increasing the phase shift control signal,
the phase difference between the low-noise in-phase coefficient and the low-noise quadrature coefficient being larger than ninety degrees results in decreasing the phase shift control signal, and
the absolute value of 90 degrees minus the phase difference between the low-noise in-phase coefficient and the low-noise quadrature coefficient, being less than 0.03 degrees, results in no change in the phase shift control signal.

15. The method of claim 10, wherein demodulating the single-sided test tone to baseband further comprises:
combining the first through $(K-1)^{th}$ in-phase analog signal, the first through $(K-1)^{th}$ quadrature analog signal and the second through $K^{th}$ amplified error signal to generate a first through $(K-1)^{th}$ error signal;
combining the $K^{th}$ in-phase and quadrature analog signals to generate a $K^{th}$ error signal;
amplifying the first through $K^{th}$ error signal to generate a first through $K^{th}$ amplified error signal;
receiving the first amplified error signal based on the in-phase sampling clock to generate an in-phase digital signal;
receiving the first amplified error signal based on the quadrature sampling clock to generate a quadrature digital signal;
generating first through $K^{th}$ up-converted in-phase signals based on first through $K^{th}$ multiplications of the in-phase digital signal with the in-phase sampling clock;
generating first through $K^{th}$ up-converted quadrature signals based on first through $K^{th}$ multiplications of the quadrature digital signal with the quadrature sampling clock;
D/A converting first through $K^{th}$ up-converted in-phase signals to generate first through $K^{th}$ in-phase analog signals; and
D/A converting first through $K^{th}$ up-converted quadrature signals to generate first through $K^{th}$ quadrature analog signals;
wherein the in-phase digital signal and the quadrature digital signal are bi-level signals;
wherein D/A conversion is a single-bit conversion; and
wherein K is between 2 and 4.

16. The method of claim 10, wherein
the single-sided test tone frequency is higher than the in-phase sampling clock frequency, and
the difference between the single-sided test tone frequency and the in-phase sampling clock frequency is less than 50 MHz.

17. The method of claim 10, wherein
the single-sided test tone frequency is lower than the in-phase sampling clock frequency, and
the difference between the single-sided test tone frequency and the in-phase sampling clock frequency is less than 50 MHz.

18. The method of claim 15, further comprising:
adding a single-ended test tone to only one of first through $K^{th}$ error signal.

* * * * *